(12) United States Patent  (10) Patent No.: US 9,190,324 B2
Liao  (45) Date of Patent: Nov. 17, 2015

(54) MANUFACTURING METHOD FOR MICRO BUMP STRUCTURE

(71) Applicant: CHIPMOS TECHNOLOGIES INC., Hsinchu (TW)

(72) Inventor: Tsung Jen Liao, Hsinchu (TW)

(73) Assignee: CHIPMOS TECHNOLOGIES INC., Hsinchu (TW)

( * ) Notice: Subject to any disclaimer, the term of this patent is extended or adjusted under 35 U.S.C. 154(b) by 89 days.

(21) Appl. No.: 13/855,264

(22) Filed: Apr. 2, 2013

(65) Prior Publication Data

US 2014/0065814 A1 Mar. 6, 2014

(30) Foreign Application Priority Data

Aug. 31, 2012 (TW) .............................. 101131683 A

(51) Int. Cl.
*H01L 21/768* (2006.01)
*H01L 23/00* (2006.01)

(52) U.S. Cl.
CPC .......... *H01L 21/76885* (2013.01); *H01L 24/11* (2013.01); *H01L 24/13* (2013.01); *H01L 2224/0401* (2013.01); *H01L 2224/05008* (2013.01); *H01L 2224/05022* (2013.01); *H01L 2224/05027* (2013.01); *H01L 2224/05548* (2013.01); *H01L 2224/05572* (2013.01); *H01L 2224/05582* (2013.01); *H01L 2224/11003* (2013.01); *H01L 2224/119* (2013.01); *H01L 2224/1111* (2013.01); *H01L 2224/1147* (2013.01); *H01L 2224/1184* (2013.01); *H01L 2224/11334* (2013.01); *H01L 2224/11849* (2013.01); *H01L 2224/131* (2013.01); *H01L 2224/13005* (2013.01); *H01L 2224/13017* (2013.01); *H01L 2224/13082* (2013.01); *H01L 2224/13147* (2013.01); *H01L 2224/94* (2013.01)

(58) Field of Classification Search
CPC .......... H01L 24/02; H01L 24/10; H01L 24/11
USPC .................................. 438/614, 106, 108, 121
See application file for complete search history.

(56) References Cited

U.S. PATENT DOCUMENTS 5,834,848 A * 11/1998 Iwasaki .......................... 257/778
(Continued)

FOREIGN PATENT DOCUMENTS

TW 200733267 A 9/2007
TW 201044498 A 12/2010

OTHER PUBLICATIONS

Office Action issued on Sep. 11, 2014 for the Taiwanese counterpart application 101131683.
(Continued)

*Primary Examiner* — Jerome Jackson, Jr.
*Assistant Examiner* — Damian A Hillman
(74) *Attorney, Agent, or Firm* — WPAT, P.C.; Anthony King

(57) ABSTRACT

A manufacturing method for a micro bump structure includes the following steps as follows. A substrate is provided and a under bump metallurgy (UBM) is formed on the substrate for accommodating a solder ball. A buffer layer is disposed on the substrate and then the solder ball is disposed on the UBM. Finally, the solder ball is grinded in order get the height reduced to a predetermined height.

28 Claims, 19 Drawing Sheets

(56) References Cited

U.S. PATENT DOCUMENTS

| | | | |
|---|---|---|---|
| 8,035,226 B1* | 10/2011 | Wilcoxen et al. | 257/738 |
| 2003/0119300 A1 | 6/2003 | Chiu et al. | |
| 2007/0045840 A1 | 3/2007 | Varnau | |
| 2012/0299181 A1* | 11/2012 | Chen et al. | 257/738 |
| 2013/0009307 A1* | 1/2013 | Lu et al. | 257/738 |
| 2013/0264684 A1* | 10/2013 | Yu et al. | 257/616 |

OTHER PUBLICATIONS

English abstract translation of office Action issued on Sep. 11, 2014 for the Taiwanese counterpart application 101131683.

English abstract translation of 200733267A.

English abstract translation of 201044498A.

* cited by examiner

MANUFACTURING METHOD FOR MICRO BUMP STRUCTURE

BACKGROUND

1. Technical Field

The present invention relates to a manufacturing method for a micro bump structure, and more particularly, to a manufacturing method of utilizing a solder ball with a normal size to fabricate a micro bump structure.

2. Background

Electronic devices incorporate a lot of electrical components and connectors for implementing a predetermined function. Solder balls are widely used in various conducting components. Since mobile devices are becoming increasingly popular; these electronic devices have to implement ways to reduce in size. Thus, the electrical components and the conducting components are required to be fabricated within a smaller size to fit such demands. In order to implement a type of miniaturization, engineers in this field often utilize expensive micro bumps to form a micro bump structure.

In light of the above-mentioned problems, a manufacturing method for a micro bump structure with low cost is most desired.

SUMMARY

The present invention provides a manufacturing method for a micro bump structure with low cost. Such a manufacturing method can utilize a solder ball in order to fabricate a micro bump structure.

In order to fabricate the same micro bump structure with an inexpensive solder ball, the present invention provides a manufacturing method for a micro bump structure.

This manufacturing method comprises the following steps. A substrate is provided, where an under bump metallurgy (UBM) layer is formed so that the solder ball can be accommodated on the UBM layer. A buffer layer is disposed on the substrate. A solder ball is placed on the UBM layer and connects the UBM layer. The solder ball is grinded to reduce the height of the solder ball to a predetermined height so that the micro bump structure is formed.

The present invention also provides another manufacturing method for a micro bump structure. This method comprises the following steps: providing a substrate; forming a UBM layer on the substrate, wherein the UBM layer is configured for accommodating a solder ball; providing a release layer; disposing a solder ball on the release layer; grinding the solder ball to reduce it to a predetermined height; connecting the solder ball with the predetermined height to the UBM layer; and removing the release layer for forming the micro bump structure.

The foregoing has outlined rather broadly the features and technical benefits of the disclosure in order that the detailed description of the disclosure that follows may be better understood. Additional features and benefits of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present invention may be derived by referring to the detailed description and claims when considered in connection with the Figures, where like reference numbers refer to similar elements throughout the Figures, and:

DETAILED DESCRIPTION

The present invention is directed to a manufacturing method for a micro bump structure. In order to make the present invention completely comprehensible, detailed steps and structures are provided in the following description. Obviously, implementation of the present invention does not limit special details known by persons skilled in the art. In addition, known structures and steps are not described in details, so as not to limit the present invention unnecessarily. Preferred embodiments of the present invention will be described below in detail. However, in addition to the detailed description, the present invention may also be widely implemented in other embodiments. The scope of the present invention is not limited to the detailed embodiments, and is defined by the claims.

References to "one embodiment," "an embodiment," "other embodiments," etc. indicate that the embodiment(s) of the disclosure so described may include a particular feature, structure, or characteristic, but not every embodiment necessarily includes the particular feature, structure, or characteristic. Further, repeated use of the phrase "in the embodiment" does not necessarily refer to the same embodiment, although it may.

In addition, unless specifically stated otherwise, as apparent from claims and detailed description, it is appreciated that throughout the specification the quantity of components is single. If the quantity of the labeled component is one, the quantifier is explained to include one unit or at least one unit. If the quantity of the labeled component is plurality, the quantifier is explained to include at least two units.

The following description of the disclosure accompanies drawings, which are incorporated in and constitute a part of this specification, and illustrate embodiments of the disclosure, but the disclosure is not limited to the embodiments. In addition, the following embodiments can be properly integrated to complete another embodiment.

Figure 1:
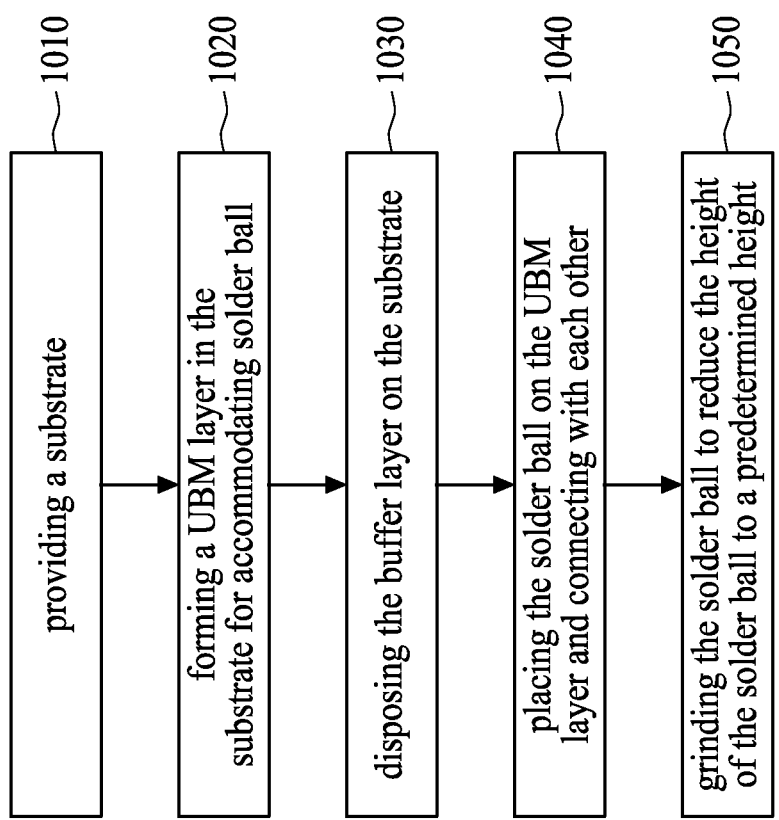
FIG. 1 is a flow chart of a manufacturing method for a micro bump structure in accordance with an embodiment of the present invention.

As shown in FIG. 1, the manufacturing method for micro bump structure includes the following steps. Step 1010 provides a substrate. Step 1020 forms an under bump metallurgy (UBM) layer on the substrate for accommodating a solder ball. Step 1030 disposes a buffer layer on the substrate. Step 1040 places a solder ball on the UBM layer and connects the solder ball and the UBM layer. Step 1050 grinds the solder ball to reduce the height of the solder ball to a predetermined height. In addition, the above-mentioned steps do not necessarily have to be in numeric order. For instance, Step 1040 can be implemented before Step 1030.

Figure 2:
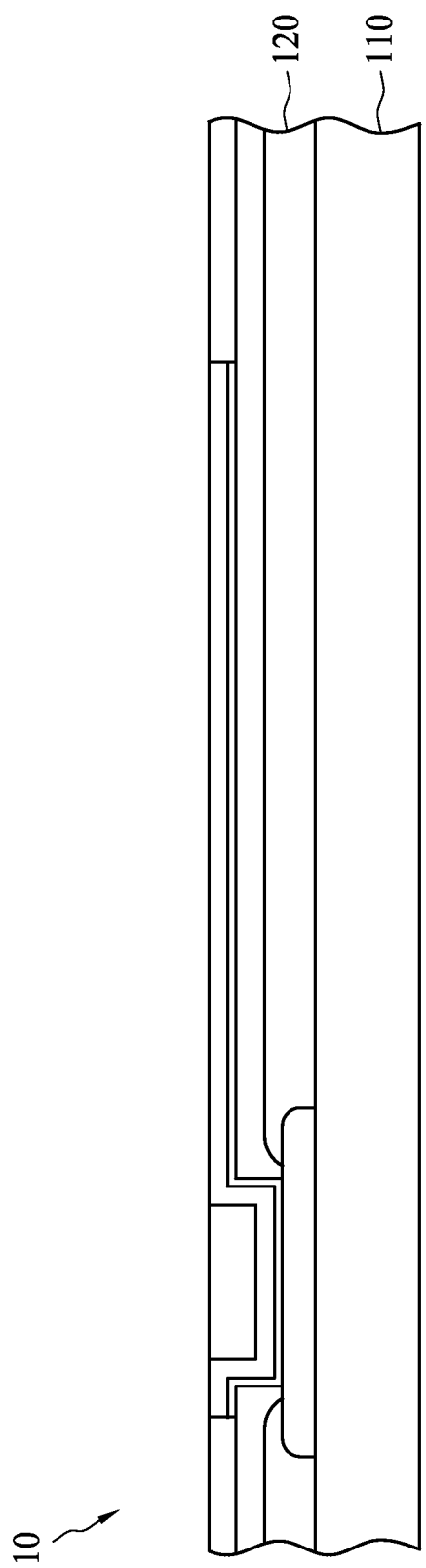
FIG. 2 is a schematic view depicting how to provide a substrate in accordance with an embodiment of the present invention.

The flow chart shown in FIG. 1 is illustrated by incorporating the structures shown in FIG. 2 to FIG. 9. In Step 1010, the substrate 10 shown in FIG. 2 is provided. The substrate 10 includes a plurality of structural layers (such as a wafer layer 110 and a nitride layer 120) and can be a wafer or chip, etc.

Figure 3:
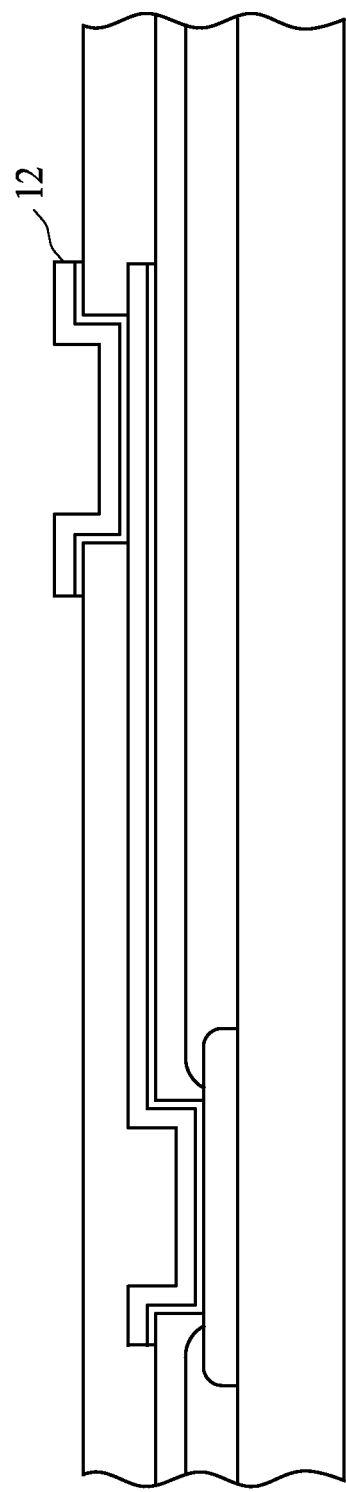
FIG. 3 is a schematic view depicting how to form a UBM layer on the substrate in accordance with an embodiment of the present invention.

In Step 1020, as shown in FIG. 3, a UBM layer 12 is formed on the substrate 10 and configured for accommodating a solder ball (not shown).

Figure 4:
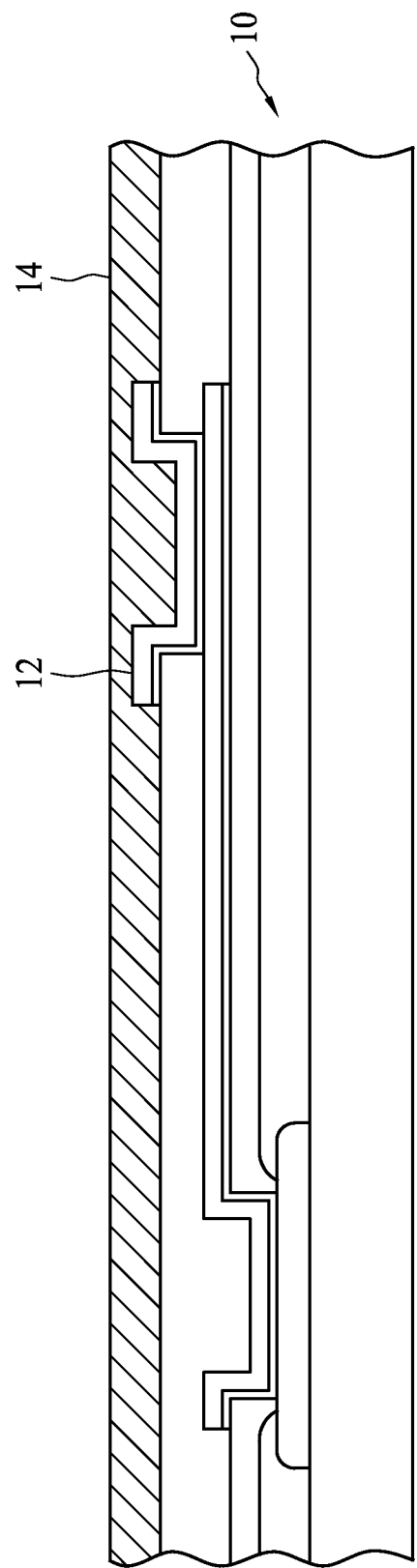
FIG. 4 is a schematic view depicting how to dispose a buffer layer on the UBM layer of the substrate in accordance with an embodiment of the present invention.

In Step 1030, as shown in FIG. 4, a buffer layer 14 is disposed on the UBM layer 12 of the substrate 10 so that the buffer layer 14 covers the UBM layer 12.

Figure 5:
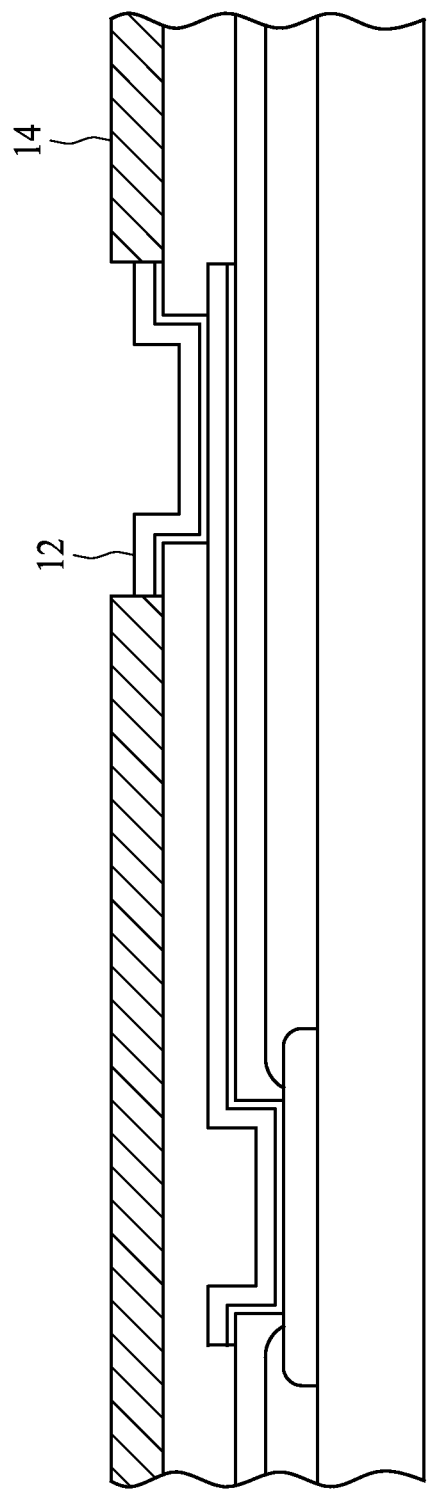
FIG. 5 is a schematic view depicting how to remove a partial area of the buffer layer through photolithography in accordance with an embodiment of the present invention.

Since the UBM layer 12 is configured to accommodate a solder ball (not shown), the buffer layer 12 covering the UBM layer 12 should be removed. In addition, the manufacturing method for a micro bump structure of the present invention further includes a step of removing a partial area of the buffer layer 14 by photolithography or general etching processes as shown in FIG. 5. Moreover, the buffer layer 14 disposing step further includes a step of disposing the buffer layer 14 on the substrate 10, wherein the buffer layer 14 does not cover the UBM layer 12, as shown in FIG. 5. In other words, the structure shown in FIG. 5 can be completed by two different processes so that the buffer layer 14 can be disposed to surround the UBM layer 12 configured for connecting with the solder ball.

In the embodiment, the material of the buffer layer 14 is selected from negative photoresist, positive photoresist, liquid photoresist, and dry film. Thus, the buffer layer 14 can expose the UBM layer 12 through photolithography. Moreover, the thickness of the buffer layer 14 ranges from half of the height of the solder ball 20 to one-third of the height of the solder ball 20.

Figure 6:
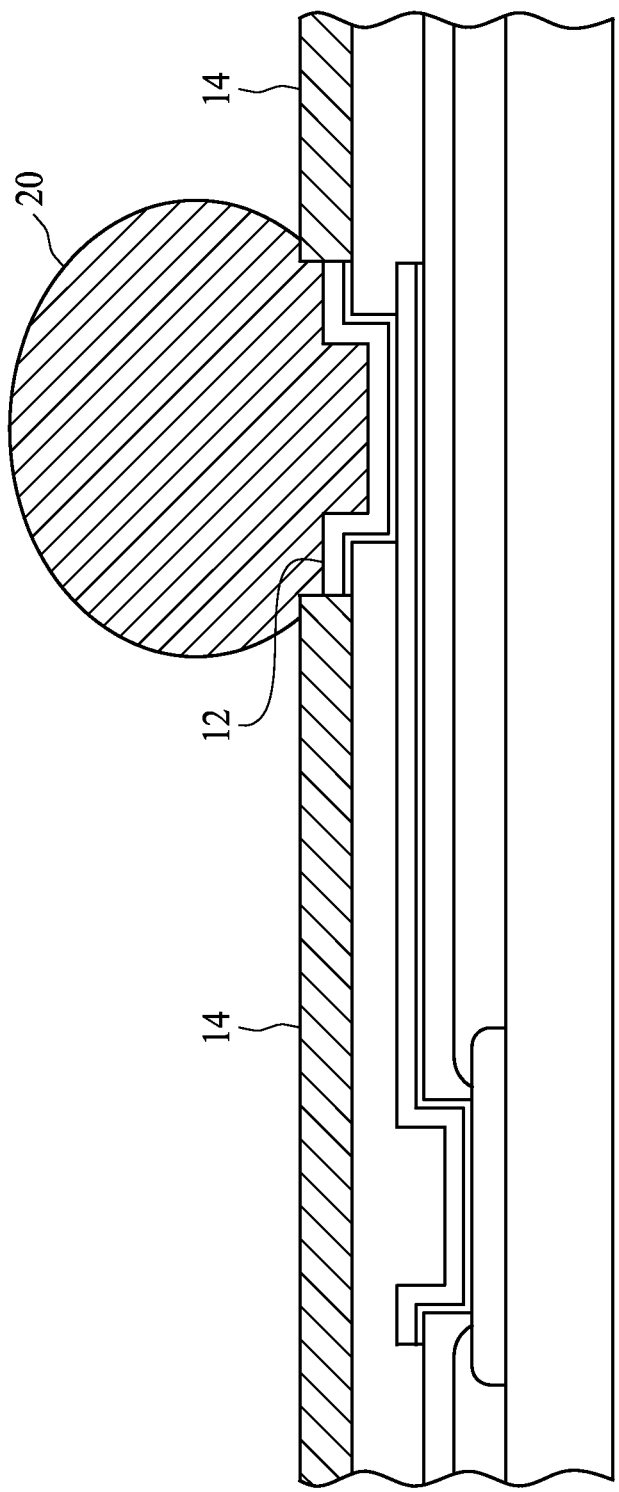
FIG. 6 is a schematic view depicting how to place the solder ball on the UBM layer and to connect the solder ball and the UBM layer in accordance with an embodiment of the present invention.

In Step 1040, as shown in FIG. 6, a solder ball 20 is placed on the UBM layer 12 and connected with the UBM layer 12.

Figure 7:
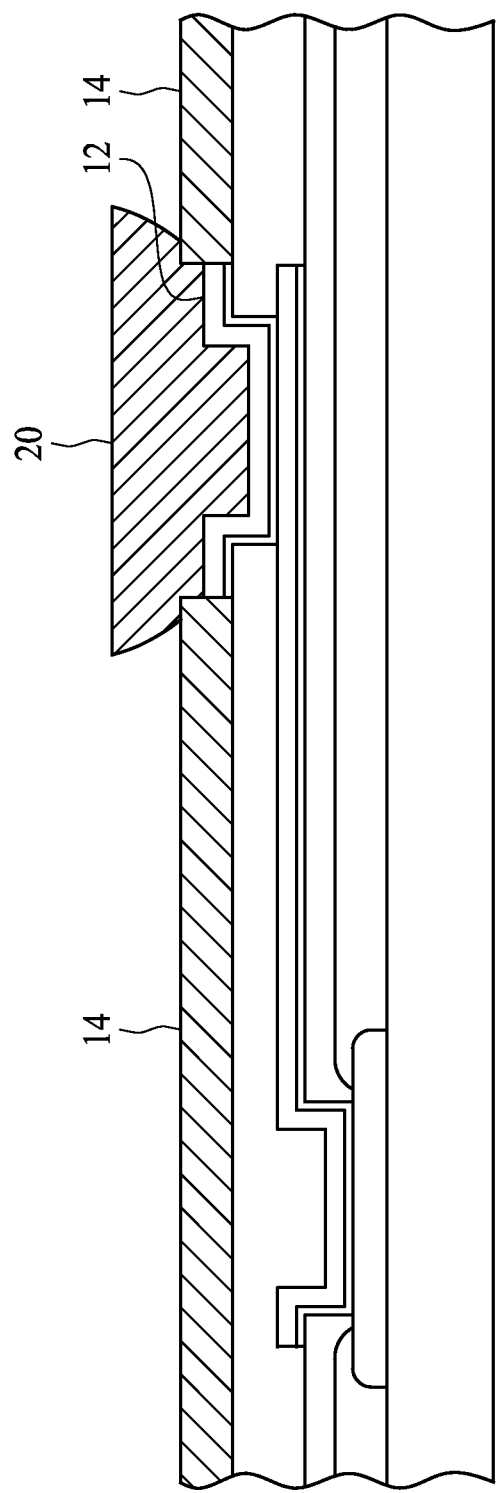
FIG. 7 is a schematic view depicting how to grind the solder ball to reduce its height to a predetermined height in accordance with an embodiment of the present invention.

In Step 1050, as shown in FIG. 7, the solder ball 20 is grinded to reduce the height of the solder ball 20 to a predetermined height, which is smaller than the original height of the solder ball 20. In addition, the buffer layer 14 can protect the substrate from grinding.

Figure 8:
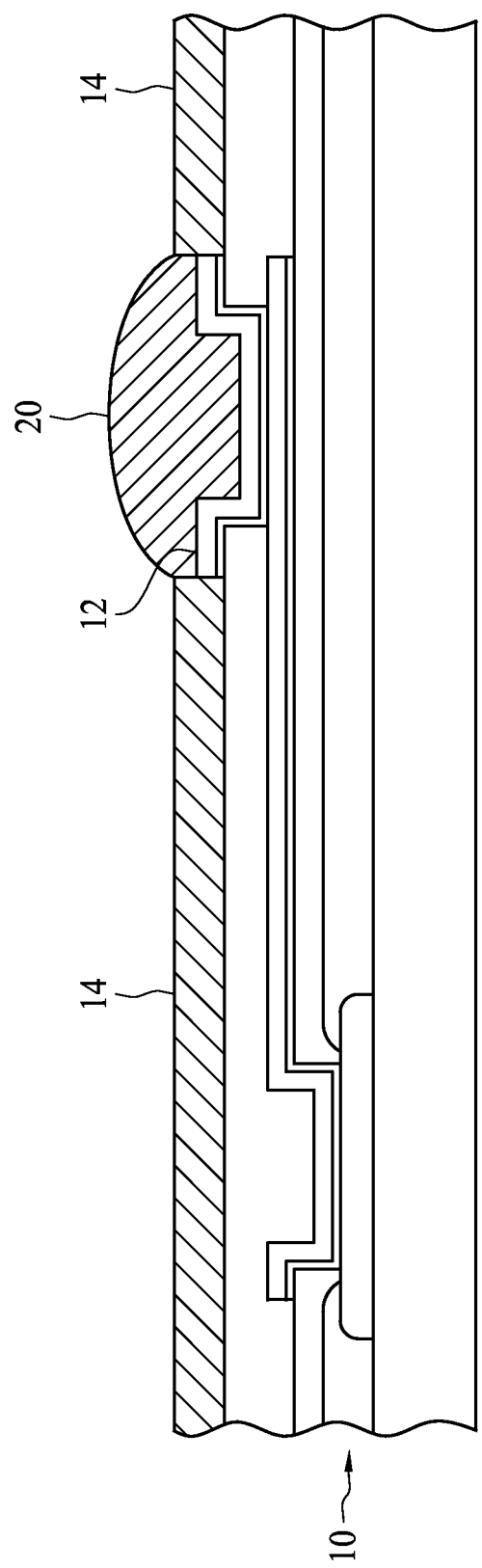
FIG. 8 is a schematic view of a reflow of heating the grinded solder ball in accordance with an embodiment of the present invention.

As shown in FIG. 8, the manufacturing method for a micro bump structure of the present invention further includes a reflow of heating the grinded solder ball 20 so that the micro bump structure can be formed from the solder ball 20 with a normal size. After the reflow, the height of the solder ball 20 is smaller than or equal to half of the height of the original solder ball 20, which is prior to being grinded.

Figure 9:
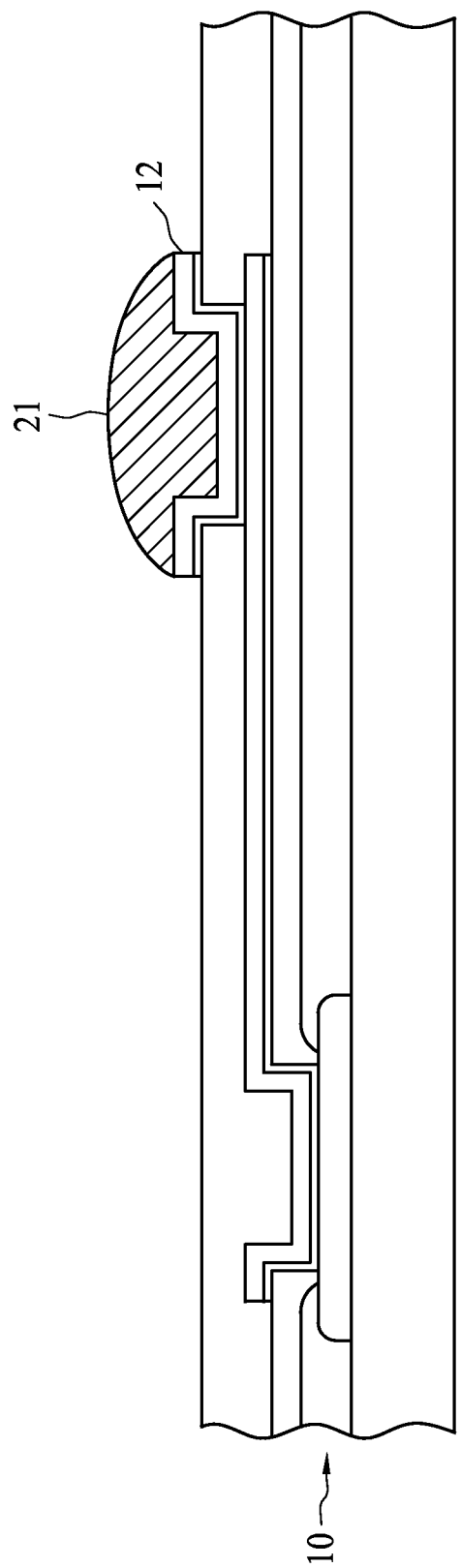
FIG. 9 is a schematic view depicting how to remove the buffer layer from the substrate to form the micro bump structure in accordance with an embodiment of the present invention.

Referring to FIG. 8 and FIG. 9, the manufacturing method for a micro bump structure of the present invention further includes a step for removing (or detaching) the buffer layer 14 from the substrate 10 so as to form a micro bump structure 21.

Figure 10:
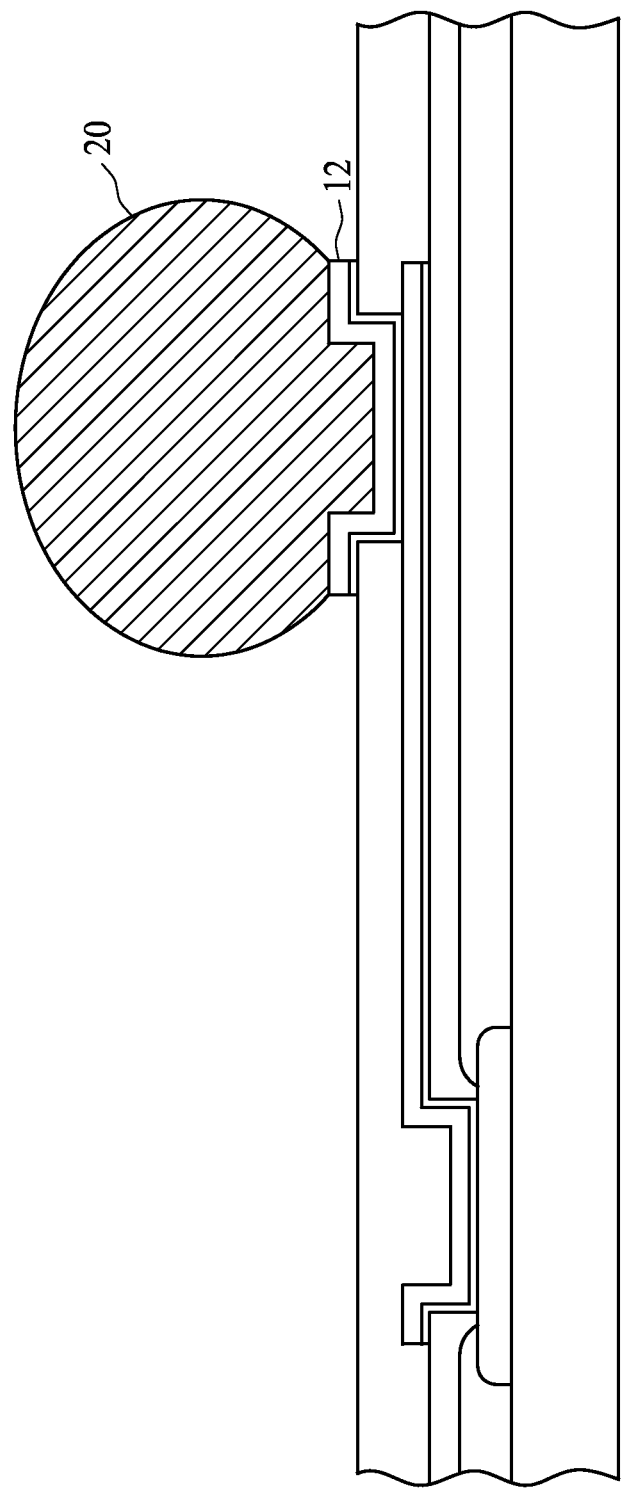
FIG. 10 is a schematic view depicting how to dispose a solder ball on the UBM layer and connect the solder ball and the UBM layer in accordance with another embodiment of the present invention.

In another embodiment of the manufacturing method for a micro bump structure of the present invention, after Steps 1010 and 1020 are implemented, Step 1040 is performed to dispose the solder ball 20 on the UBM layer 12 to connect the solder ball 20 and the UBM layer 12, as shown in FIG. 10.

Figure 11:
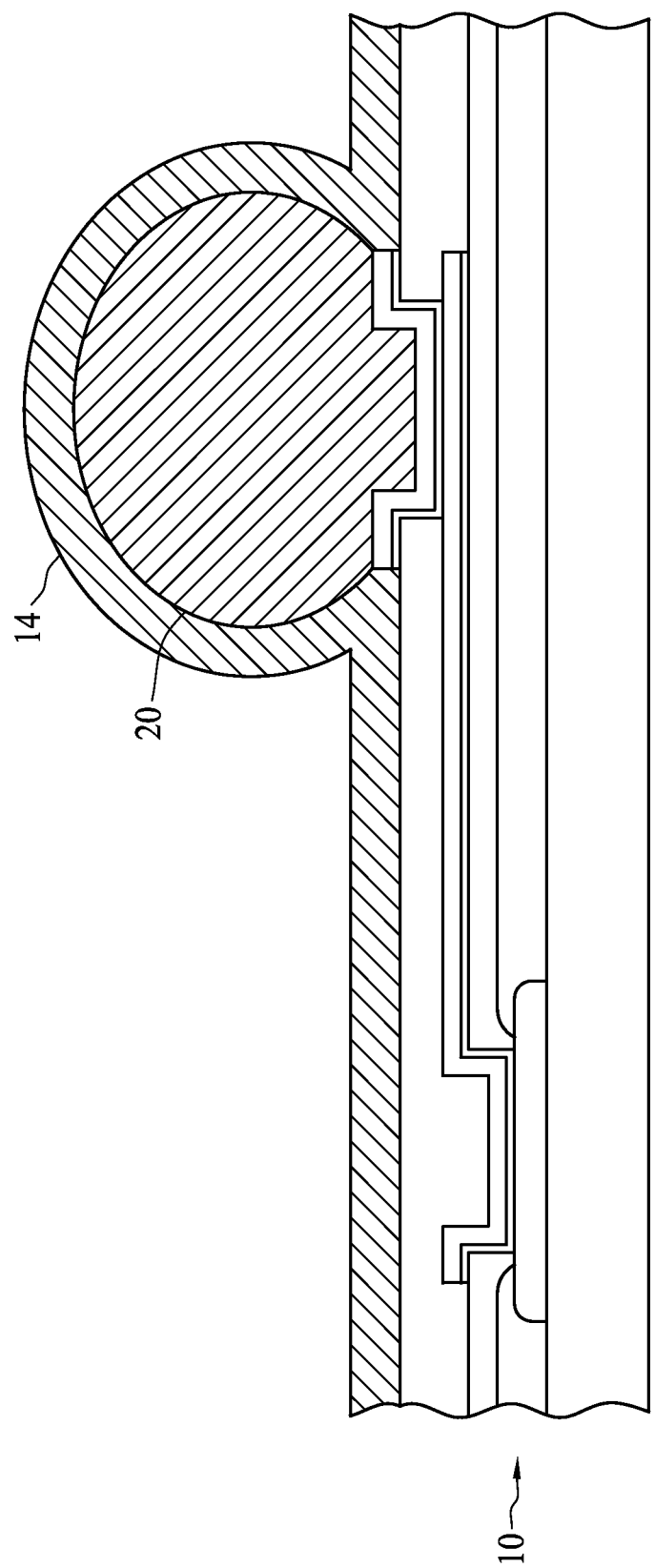
FIG. 11 is a schematic view depicting how to dispose the buffer layer on the solder ball placed on the substrate and covering the solder ball in accordance with another embodiment of the present invention.

In Step 1030, as shown in FIG. 11, the buffer layer 14 is disposed on the solder ball 20 of the substrate 10 so that the solder ball 20 is covered by the buffer layer 14. In the embodiment, the material of the buffer layer 14 is selected from negative photoresist, positive photoresist, liquid photoresist, and dry film. The thickness of the buffer layer 14 ranges from half of the height of the solder ball 20 to one-third of the height of the solder ball 20.

Moreover, the manufacturing method for a micro bump structure of the present invention further includes a step of photolithographing the buffer layer 14. As shown in FIG. 6, after the buffer layer 14 is exposed through photolithography or etching processes, the buffer layer 14 will expose the solder ball 20 on the UBM layer 12. After the processes of the above-mentioned FIG. 7 to FIG. 9, the micro bump structure 21 of the present invention can be formed.

Figure 12:
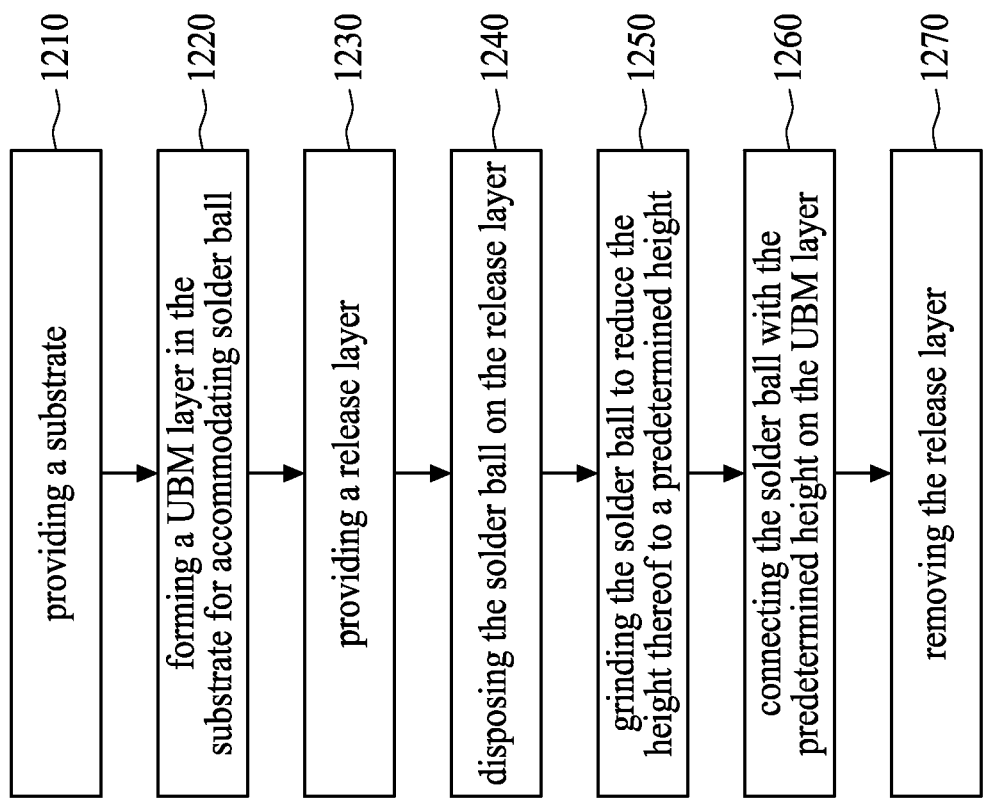
FIG. 12 is a flow chart of a manufacturing method for a micro bump structure in accordance with another embodiment of the present invention.

As shown in FIG. 12, the manufacturing method for a micro bump structure further includes the following steps. A substrate is provided in Step 1210. A UBM layer is formed in the substrate for accommodating a solder ball in Step 1220. A release layer is provided in Step 1230. A solder ball is disposed on the release layer in Step 1240. The solder ball is grinded to reduce the height of the solder ball to a predetermined height in Step 1250. The solder ball with the predetermined height is connected to the UBM layer in Step 1260. The release layer is removed in Step 1270. In addition, the above-mentioned steps do not necessarily have to be in numeric order.

The flow chart shown in FIG. 12 is illustrated by incorporating the structures shown in FIG. 13 to FIG. 18. Since Steps 1210 and 1220 are similar to the above-mentioned Steps 1010 and 1020, the description of Steps 1210 and 1220 can refer to the description of the above-mentioned Steps 1010 and 1020.

Figure 13:
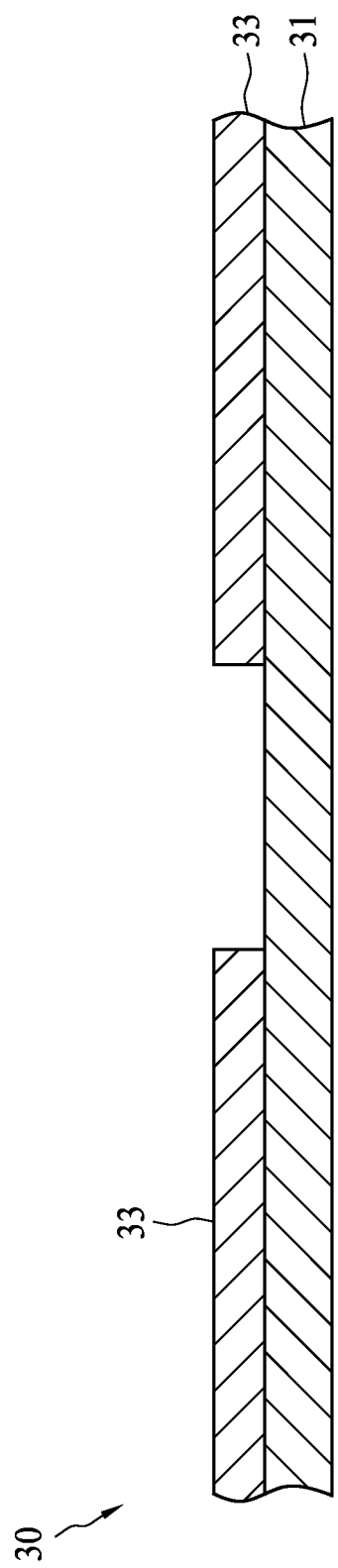
FIG. 13 is a schematic view depicting how to provide a release layer in accordance with another embodiment of the present invention.

In Step 1230, as shown in FIG. 13, a release layer 30 is provided. The release layer 30 includes a base layer 31 and a buffer layer 33. The buffer layer 33 is disposed on the base layer 31. In the embodiment, the base layer 31 may be a copper film, while the buffer layer 33 may be a dry film. The thickness of the dry film ranges from half of the height of the solder ball 20 to one-third of the height of the solder ball 20. In addition, the buffer layer 33 may be a dry film photoresist, which is composed of a cover film (made of polyester/PET), a photoresist and a base film (made of polyethylene/PE). However, the dry film photoresist is one of the embodiments in the present invention, which is not limited to such an embodiment. In another embodiment, as shown in FIG. 13, the buffer layer 33 exposes a partial area of the base layer 31 so that the structure shown in FIG. 13 is formed through photolithography. In the embodiment, the material of the buffer layer 33 is selected from negative photoresist, positive photoresist, and liquid photoresist. Thus, after the buffer layer 33 is exposed by photolithographing, the partial area of the base layer 31 is exposed by the buffer layer 33, which is removed through photolithography.

Figure 14:
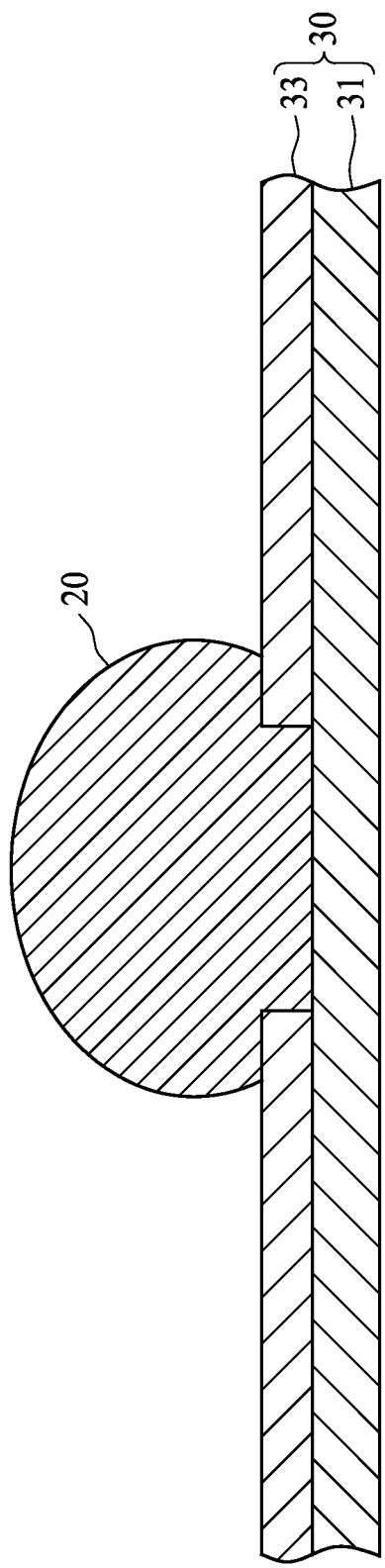
FIG. 14 is a schematic view depicting how to dispose a solder ball on the release layer in accordance with another embodiment of the present invention.

In Step 1240, as shown in FIG. 14, a solder ball 20 is disposed on the release layer 30. More particularly, the solder ball 20 is disposed on the base layer 31, which is exposed by the buffer layer 33. In other words, the solder ball 20 is disposed in a position where the buffer layer 33 exposes the base layer 31. Moreover, in another embodiment (not shown), the solder ball 20 can be disposed on the base layer 31 before the buffer layer 33 is disposed to surround the solder ball 20 so as to form a structure shown in FIG. 14.

Figure 15:
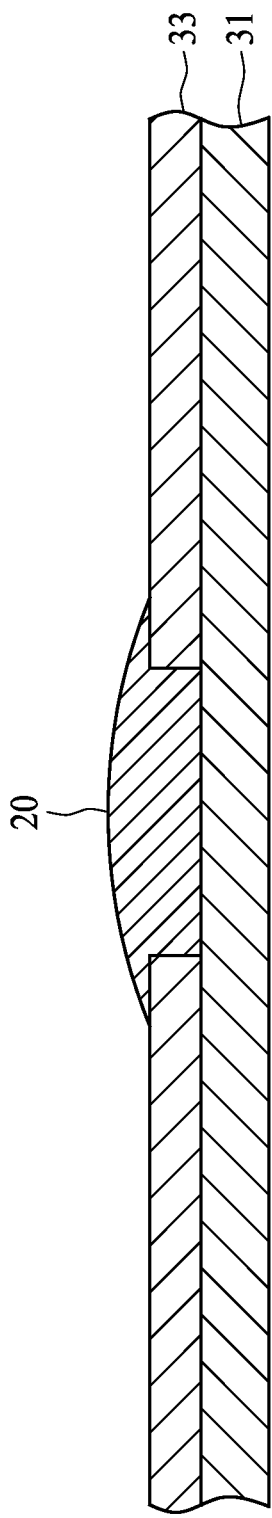
FIG. 15 is a schematic view depicting how to grind the solder ball on the release layer to reduce the height of the solder ball to a predetermined height in accordance with another embodiment of the present invention.

In Step 1250, as shown in FIG. 15, the solder ball 20 is grinded so as to reduce the height of the solder ball 20 to a predetermined height.

Figure 16:
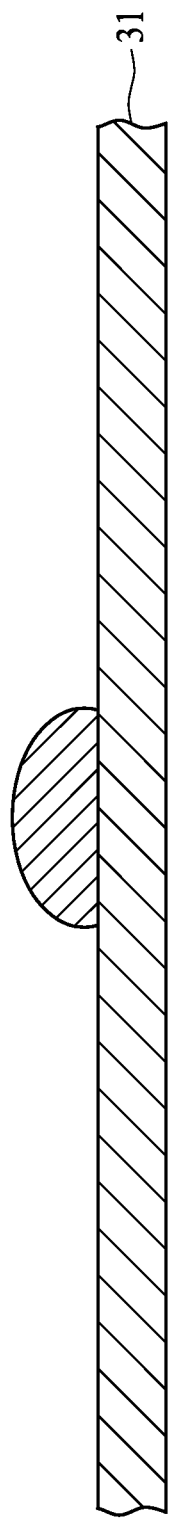
FIG. 16 is a schematic view depicting how to remove the buffer layer from the substrate in accordance with another embodiment of the present invention.

Referring to FIG. 15 and FIG. 16, the manufacturing method for a micro bump structure further includes a step of removing the buffer layer 33 from the base layer 31.

Figure 17:
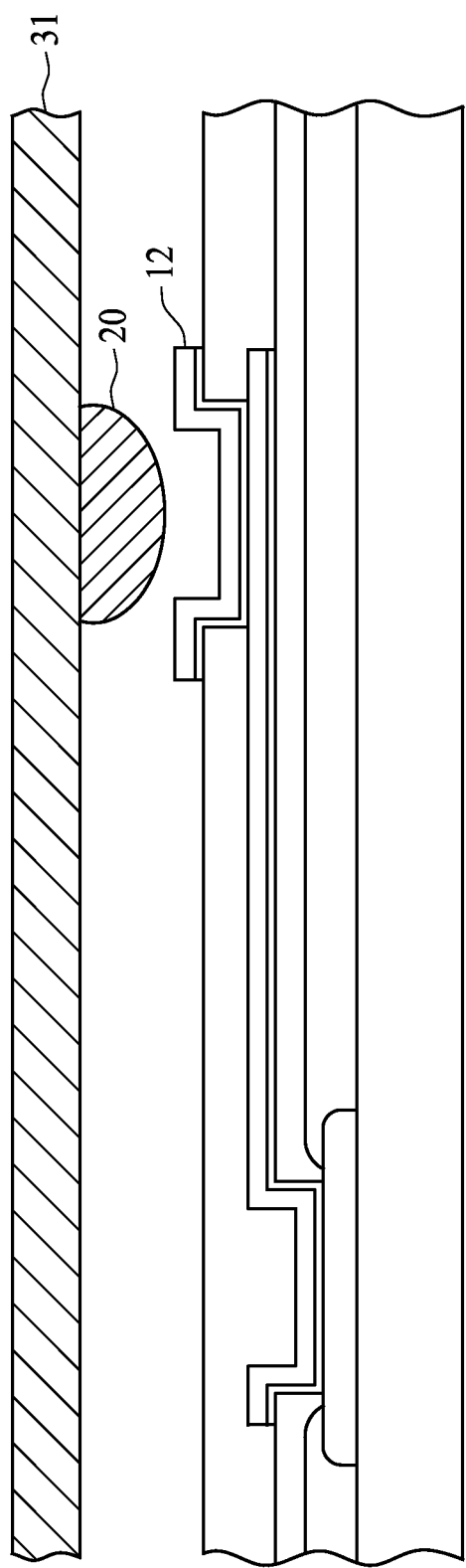
FIG. 17 is a schematic view depicting how to connect the solder ball with a predetermined height on the UBM layer in accordance with another embodiment of the present invention.

In Step 1260, as shown in FIG. 17, a solder ball 20 with a predetermined height is connected to the UBM layer 12. In Step, the UBM layer 12 can be pre-applied with a flux (not shown) so as to connect with the solder ball 20. The step of connecting the solder ball further includes a reflow for heating the grinded solder ball 20. The height of the heated solder ball 20, after the reflow, is smaller than or equal to half of the height of the original solder ball 20. Since the base layer 31 may include a copper film, the reflow in the solder ball connecting step should melt certain proportion of copper and the solder ball 20 so that the proportion of copper in the solder ball 20 can be increased.

Figure 18:
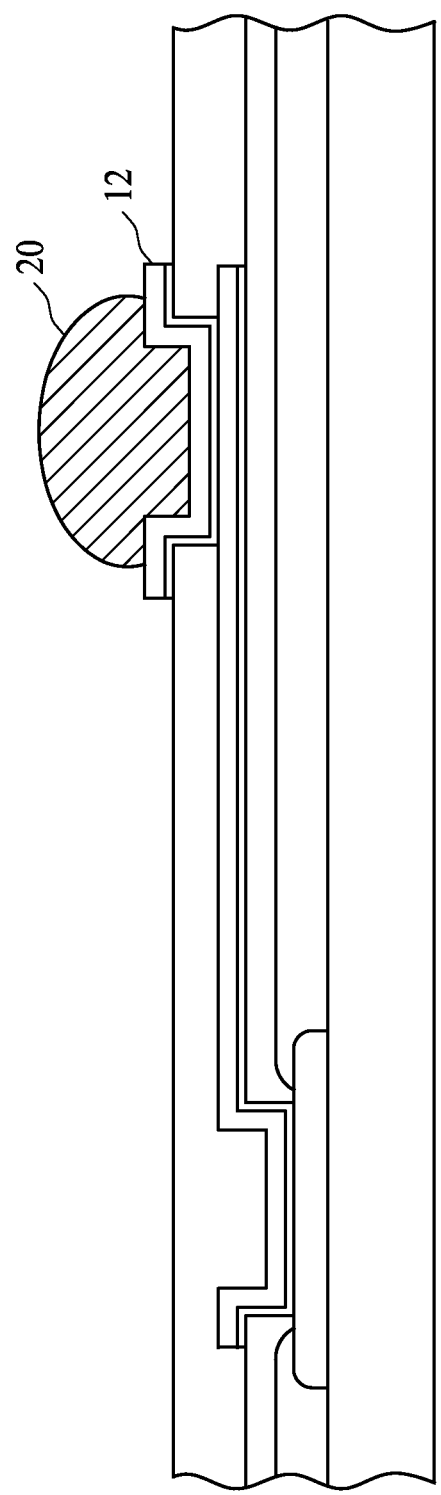
FIG. 18 is a schematic view depicting how to remove the release layer in accordance with another embodiment of the present invention.

In Step 1270, as shown in FIG. 17 and FIG. 18, after the solder ball connecting step, the micro bump structure as shown in FIG. 18 is formed by removing the base layer 31 of the release layer 30.

Figure 19:
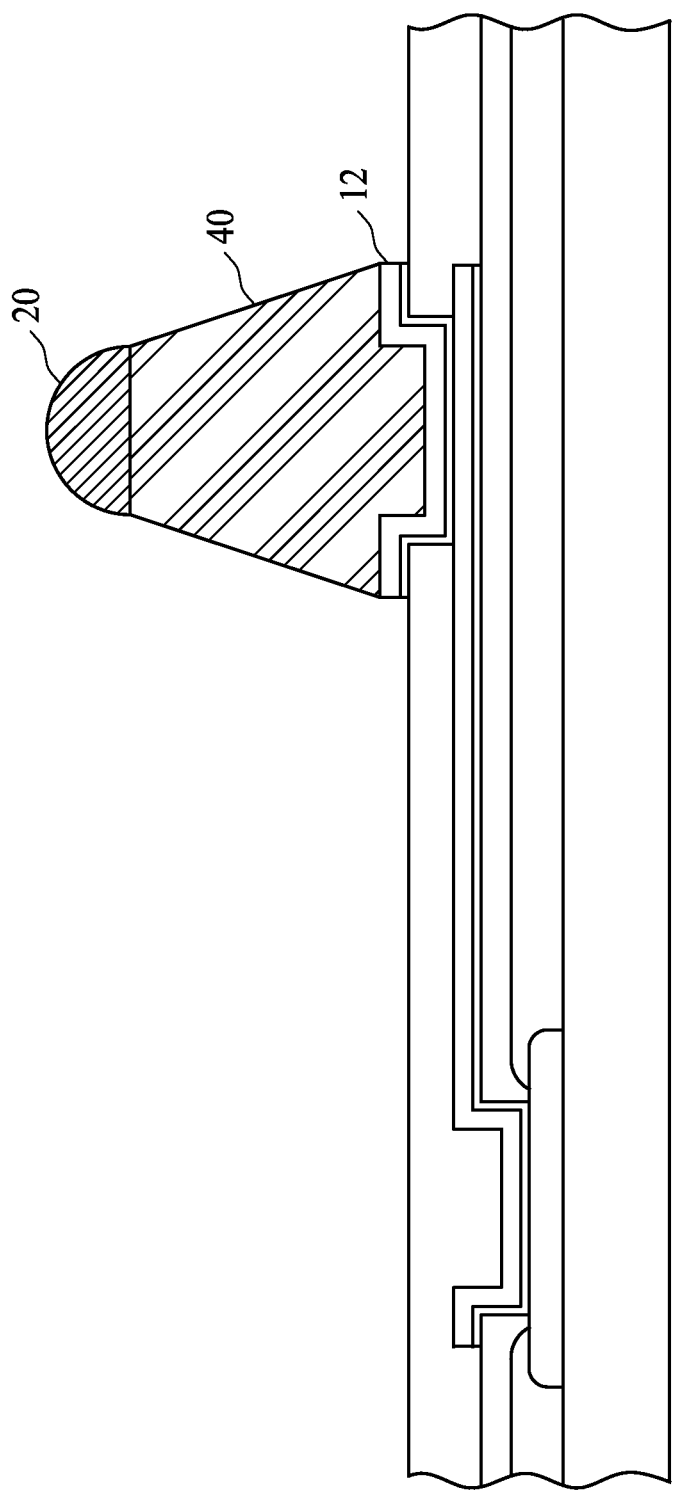
FIG. 19 is a schematic view of the micro bump structure in accordance with another embodiment of the present invention.

Furthermore, in Step 1220, the manufacturing method further includes a step of disposing a copper pillar 40 on the UBM layer 12, as shown in FIG. 19. After the step of grinding the solder ball 20, the grinded solder ball 20 is connected to the copper pillar 40 so as to form a micro bump structure shown in FIG. 19. Similarly, the copper pillar 40 can be applied with a flux (not shown) for connecting with the solder ball 20.

Although the present invention and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A manufacturing method for a micro bump structure, comprising:
   providing a substrate;
   forming an under bump metallurgy (UBM) layer on the substrate, wherein the UBM layer is configured for accommodating a solder ball;
   disposing a buffer layer on the substrate;
   placing the solder ball on the UBM layer to connect the solder ball and the UBM layer;
   grinding the solder ball to reduce the height of the solder ball to a predetermined height, with the solder ball being laterally abutting the buffer layer; and
   removing the buffer layer from the substrate.

2. The manufacturing method according to claim 1, wherein the buffer layer is disposed on the UBM layer.

3. The manufacturing method according to claim 2, further comprising a step of photolithographing the buffer layer to expose the UBM layer.

4. The manufacturing method according to claim 1, wherein the buffer layer disposing step further comprises a step of disposing the buffer layer on the substrate and the buffer layer does not cover the UBM layer.

5. The manufacturing method according to claim 1, wherein the buffer layer disposing step further comprises a step of disposing the buffer layer to surround the solder ball.

6. The manufacturing method according to claim 4, further comprising a step of removing the buffer layer from the substrate.

7. The manufacturing method according to claim 5, further comprising a step of removing the buffer layer from the substrate.

8. The manufacturing method according to claim 6, further comprising a reflow for heating the grinded solder ball.

9. The manufacturing method according to claim 7, further comprising a reflow for heating the grinded solder ball.

10. The manufacturing method according to claim 8, wherein the height of the heated solder ball to be smaller than or equal to half of the height of the original solder ball after the reflow.

11. The manufacturing method according to claim 9, wherein the height of the heated solder ball to be smaller than or equal to half of the height of the original solder ball after the reflow.

12. The manufacturing method according to claim 1, wherein the thickness of the buffer layer ranges from half to one-third of the height of the solder ball.

13. The manufacturing method according to claim 1, further comprising a step of disposing a copper pillar on the UBM layer.

14. A manufacturing method for micro bump structure, comprising steps of:
- providing a substrate;
- forming a UBM layer on the substrate, wherein the UBM layer is configured for accommodating a solder ball;
- providing a release layer;
- disposing a solder ball on the release layer;
- grinding the solder ball to reduce the height of the solder ball to a predetermined height;
- connecting the solder ball with the predetermined height to the UBM layer; and
- removing the release layer.

15. The manufacturing method according to claim 14, wherein the release layer comprises a base layer and a buffer layer, and the buffer layer is disposed on the substrate.

16. The manufacturing method according to claim 15, wherein the base layer comprises a copper film.

17. The manufacturing method according to claim 15, wherein the base layer is a dry film.

18. The manufacturing method according to claim 15, further comprising a step of photolithographing the buffer layer to expose the base layer.

19. The manufacturing method according to claim 15, wherein the buffer layer disposing step further comprises a step of disposing the buffer layer to surround the solder ball.

20. The manufacturing method according to claim 15, further comprising a step of removing the buffer layer from the base layer.

21. The manufacturing method according to claim 16, further comprising a step of removing the buffer layer from the base layer.

22. The manufacturing method according to claim 17, further comprising a step of removing the buffer layer from the base layer.

23. The manufacturing method according to claim 18, further comprising a step of removing the buffer layer from the base layer.

24. The manufacturing method according to claim 19, further comprising a step of removing the buffer layer from the base layer.

25. The manufacturing method according to claim 14, wherein the solder ball connecting step further comprises a reflow for heating the grinded solder ball.

26. The manufacturing method according to claim 25, wherein the height of the heated solder ball to be smaller than or equal to half of the height of the original solder ball after the reflow.

27. The manufacturing method according to claim 14, wherein the thickness of the buffer layer ranges from half to one-third of the height of the solder ball.

28. The manufacturing method according to claim 14, further comprising a step of disposing a copper pillar on the UBM layer.

* * * * *